United States Patent [19]

Scovell et al.

[11] Patent Number: 4,563,805

[45] Date of Patent: Jan. 14, 1986

[54] MANUFACTURE OF MOSFET WITH METAL SILICIDE CONTACT

[75] Inventors: Peter D. Scovell, Chelmsford; Paul J. Rosser; Gary J. Tomkins, both of Harlow, all of United Kingdom

[73] Assignee: Standard Telephones and Cables, PLC, London, England

[21] Appl. No.: 748,135

[22] Filed: Jun. 24, 1985

Related U.S. Application Data

[63] Continuation of Ser. No. 587,466, Mar. 8, 1984, abandoned.

[51] Int. Cl.⁴ .................. H01L 21/385; H01L 21/443
[52] U.S. Cl. ........................................ 29/571; 29/578; 29/590; 148/1.5; 148/188
[58] Field of Search ................ 29/571, 578, 590; 148/1.5, 188

[56] References Cited

U.S. PATENT DOCUMENTS

| | | | |
|---|---|---|---|
| 3,617,824 | 11/1971 | Shinoda et al. | 148/187 X |
| 4,319,395 | 3/1982 | Lund et al. | 29/579 X |
| 4,415,383 | 11/1983 | Naem et al. | 29/571 X |
| 4,432,133 | 2/1984 | Furuya | 29/571 |
| 4,521,952 | 6/1985 | Riseman | 29/590 |

FOREIGN PATENT DOCUMENTS 2062959  5/1981  United Kingdom .

Primary Examiner—George T. Ozaki
Attorney, Agent, or Firm—Dennis P. Clarke

[57] ABSTRACT

Polysilicon elements of integrated circuits, for example gates (24) or interconnects, are provided with metallic silicide layers (26) in order to take advantage of the lower resistivity thereof. The polysilicon elements are defined on an oxide layer (23) disposed on a silicon substrate (20) before polysilicon metallization. After polysilicon metallization the metal and polysilicon are caused to interdiffuse to form silicide layers (26) covering the polysilicon elements (24).

4 Claims, 9 Drawing Figures

MANUFACTURE OF MOSFET WITH METAL SILICIDE CONTACT

This is a continuation of application Ser. No. 587,466, filed Mar. 8, 1984, now abandoned.

BACKGROUND OF THE INVENTION

This invention relates to semiconductor devices and the manufacture thereof and, in particular, to semiconductor processing employing silicides.

Polysilicon has conventionally been employed for gates and interconnections in integrated circuits. However, for small geometry, high speed integrated circuits it is desirable to use alternative materials with lower resistivity, such as silicide materials. The resistivity of polysilicon is high (1000 $\mu\Omega$cm) and roughly fifty times larger than some silicides, for example titanium disilicide has a resistivity of 20 $\mu\Omega$cm, and thus interconnections of polysilicon are extremely resistive in fine-line circuits. The propagational delay of electrical signals in such interconnect lines is a function of the product of the lumped capacitance and resistance of the interconnect line. As devices sizes are scaled down to achieve higher packing densities and speeds, this delay becomes dominated by the resistive component and thus new materials must be used. Silicides comprise such alternative materials which can be entirely compatible with the other components of the manufacturing process. Provided that the introduction of the material does not significantly perturb the existing process, the advantage of the new material can also be exploited in present day technologies.

A process has been developed whereby the silicide is formed by interdiffusing a layer of metal (tungsten, molybdenum, titanium, tantalum, etc.) with a sheet of doped polysilicon used to form the conventional gate and interconnects. This heterogeneous layer is then etched to form the gate and interconnects of the device. However, because the silicide overlying the doped polysilicon etches at different rates from the polysilicon, some undesirable undercutting at the gate occurs.

An alternative process has been developed to silicide the gate and diffused regions, however this is a complex process.

The undercutting problems of the first mentioned process and the complexity of the second represent considerable barriers to the implementation of silicide into an existing process.

BRIEF SUMMARY OF THE INVENTION

According to the present invention there is provided a method of manufacturing semiconductor devices including the steps of defining at least one polysilicon element on an oxidised surface of a silicon substrate, metallising the at least one defined polysilicon element, including sidewalls thereof, and causing the interdiffusion of the metal and the polysilicon whereby to form a metallic silicide layer extending over the at least one defined polysilicon element and up to the said oxidised surface on which the at least one defined polysilicon element is disposed.

DETAILED DESCRIPTION

Figure 1A:
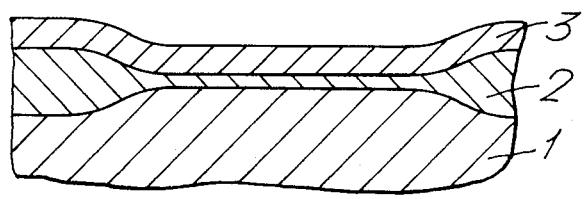
FIGS. 1a to c represent in schematic cross-section successive stages in the first-mentioned known process.
Figure 1B:
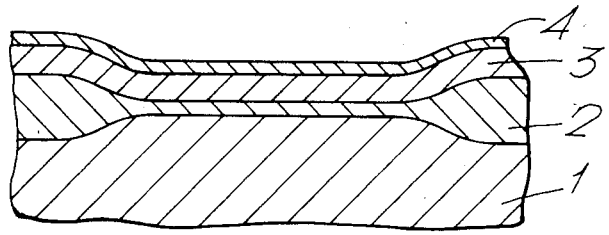
Figure 1C:
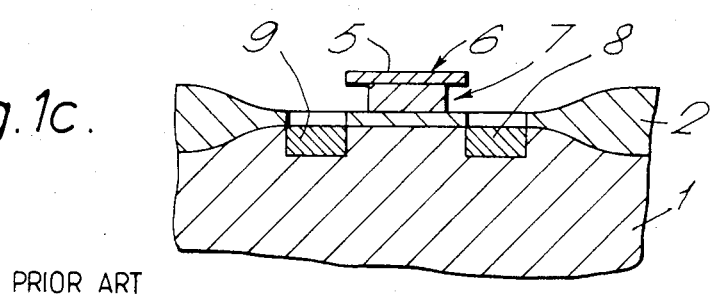

The known process shown in FIGS. 1a to c comprises the following steps. On a silicon substrate 1, an oxide layer 2, which is thin in the area where source, drain and gate regions of the device are to be formed, is provided by conventional means. A layer of doped polycrystalline silicon (polysilicon) 3 is provided over the oxide 2 (FIG. 1a). A metal layer 4 (FIG. 1b) of, for example, tungsten, molybdenum, titanium or tantalum, is deposited on the polysilicon layer 3. A metallic silicide layer (FIG. 1c) is formed by interdiffusing layers 3 and 4. The structure is then etched to form the gate 6 of the device and interconnects (not shown) and, because the silicide 5 etches at a different rate from the doped polysilicon 3, undercutting as at 7 occurs. The source 8 and drain 9 regions are next defined and implanted or diffused, and the process continues with the conventional oxidation step (intermediate oxide) (not shown), the oxidation at the silicide layer of the gate 6 relying on the diffusion of silicon from the underlying polysilicon to feed the oxidation process. The commercial process which employs this procedure is termed the POLYCIDE process. Adoption of the POLYCIDE process results in few changes when compared with the conventional polysilicon process, except that it introduces difficulties in etching the heterogeneous structure.

Figure 2A:
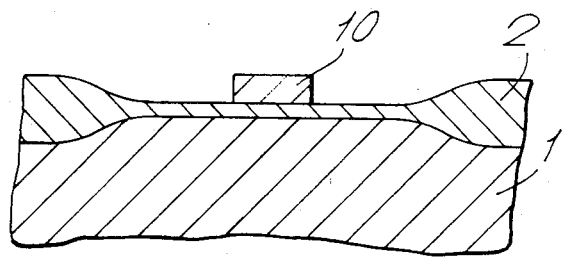
FIGS. 2a to c represent in schematic cross-section successive stages in the second-mentioned known process.
Figure 2B:
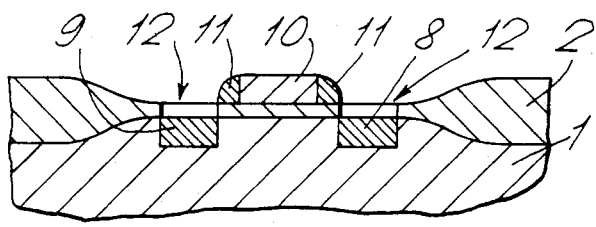
Figure 2C:
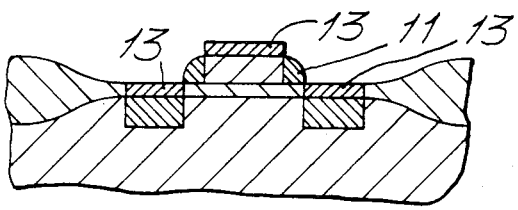

In the other known process illustrated in FIGS. 2a to c and termed the SALICIDE process, the gate, interconnect, and diffused regions are silicided. In this process a polysilicon gate 10 is defined conventionally upon oxide layer 2 on substrate 1. A layer of CVD (chemical vapour deposited) oxide is deposited over the gate 10 and interconnects (not shown) and this oxide is etched anisotropically to leave side wall spacers 11 of oxide adjacent the gate 10. This etching serves also to open windows 12, via which the source and drain regions 8 and 9 are formed conventionally, and to remove any oxide in the contact areas and on the polysilicon 10. A layer of metal, for example titanium, tantalum etc., is then deposited over the substrate surface and metallic silicide 13 formed by interdiffusing in a furnace the metal of the layer and the silicon. Only in the areas of exposed silicon can the silicide form and no change occurs where the metal is deposited over oxide. The residual (unreacted) metal is then etched away preferentially to leave the silicide 13 in the diffused, and gate interconnect areas as illustrated in FIG. 2c, together with other interconnect areas, not shown. This method is called SALICIDE (self-aligned silicide), the silicide being self-aligned to the exposed silicon. Processing continues with the conventional oxidation step etc. The oxide sidewall spacers 11 introduce complexities with regard to processing, but they are essential to avoid gate to source/drain short circuits.

Figure 3A:
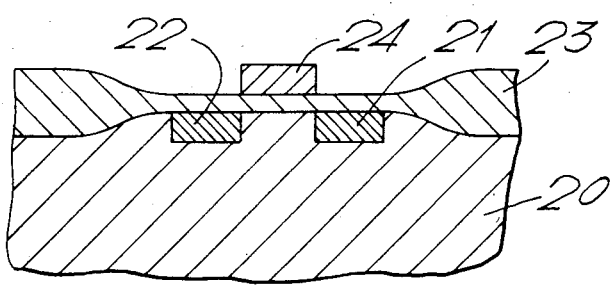
FIGS. 3a to c represent in schematic cross-section successive stages, in a method according to the present invention.
Figure 3B:
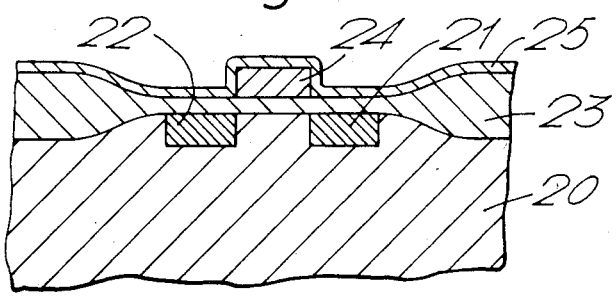
Figure 3C:
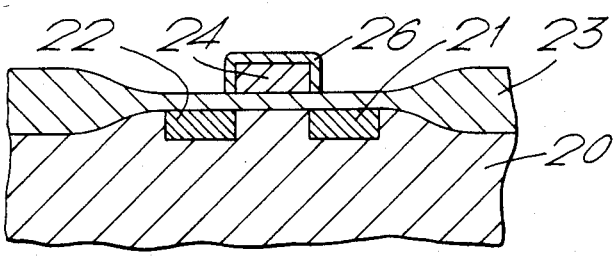

An embodiment of the present invention is illustrated in FIGS. 3a to c. FIG. 3a shows a silicon substrate 20 in which source and drain regions 21 and 22 have been provided by suitable processing, for example selective diffusion or implantation. An oxide layer 23 extends over the entire surface of the substrate 20 and as illustrated is thinner in the source, drain and gate region due to the processing involved. A layer of doped polycrystalline silicon (polysilicon) is provided over the oxide 23 and etched to define a polysilicon gate 24 aligned with the source and drain regions 21 and 22, together with interconnects (not shown). A layer of metal 25 (FIG. 3b), for example, titanium, tungsten, tantalum, molybdenum etc., is then deposited over the polysilicon gate 24, interconnects and the exposed oxide 23. During a subsequent annealing process the metal overlying the polysilicon gate 24 and polysilicon interconnects becomes interdiffused therewith to form a metallic silicide, whereas there is no reaction between the metal and any directly underlying oxide. The residual (unreacted) metal is etched away to leave a metallic silicide 26 (FIG. 3c) over the gate 24 and around its sidewalls and similarly over and around the interconnects. Processing continues with the conventional intermediate oxidation using the underlying polysilicon as a source of silicon to feed the oxidation process at the gate. The etchant employed to define the polysilicon gate 24 and interconnects must be sufficiently selective to leave the oxide 23 over the diffused regions 21 and 22, otherwise silicides would form in these regions leading to gate to source/drain short circuits.

A suitable annealing process is a transient (pulse) process which comprises raising the temperature of the thus processed silicon substrate to 800° C. within 10 seconds and then allowing it to cool naturally. This annealing is performed in a chamber which is purged by nitrogen and the oxygen and water concentrations should not exceed 2 rpm. Such annealing may be performed using a commercial halogen lamp annealing equipment such as "Heatpulse" as supplied by A.G. Associates of Palo Alto, Calif., United States of America.

In the case of titanium we have found that it is necessary to interdiffuse the titanium and polysilicon using such a pulse annealing technique since titanium has such a strong affinity for oxygen and normal furnace annealing results in oxidation of the metal before the silicide is formed. Even with use of an inert gas (nitrogen) in a normal furnace, air trapped between wafers during loading in the furnace and contamination of the inert gas with small quantities of oxygen and water leads to significant oxidation.

Our United Kingdom patent application No. 8203242 (Ser. No. 2114809) relates to the formation of silicides from titanium and silicon which are deposited as a plurality of alternate layers, or are co-sputtered, and are pulse annealed. The present application, however, is concerned with a process for forming a silicide layer, by interdiffusing a single separate metallic layer, preferably titanium, overlying a defined polysilicon element, which can be readily implemented into an existing manufacturing process.

The proposed process is similar to the POLYCIDE process but differs therefrom in that the gate and interconnects are defined before the metal deposition step and in that no undercutting results. The proposed process can be implemented with conventional processing technology and does not disturb the overall conventional polysilicon process significantly, whilst resulting in low interconnect resitance values and retaining the oxidisability of the resulting silicide composite.

We claim:

1. In a method of manufacturing an MOS semiconductor device which includes the two steps of providing a polysilicon gate element by etching a polysilicon layer disposed on an oxide layer which is itself disposed on a silicon substrate and of subsequently oxidizing the thus processed silicon substrate, said source and drain regions being disposed under said oxide layer and aligned with said gate element, the improvement consisting of performing the following additional steps between the above said two steps, said additional steps consisting of depositing a metal layer to extend over the entire exposed surface of the polysilicon gate element including side wall portions thereof and over the portions of the oxide layer exposed by said polysilicon etching step, performing an annealing step in which the metal and the polysilicon are caused to interdiffuse over said entire polysilicon gate element surface whereby to form a metallic silicide layer which extends up to said oxide layer at least at said side wall portions, and removing by etching the unreacted metal on the oxide layer.

2. A method as claimed in claim 1, wherein the metal is titanium.

3. A method as claimed in claim 1, wherein said interdiffusion is achieved by pulse annealing in an inert atmosphere.

4. A method as claimed in claim 1, wherein said interdiffusion is achieved by pulse annealing in nitrogen.

* * * * *